United States Patent
Mulder

(10) Patent No.: US 7,256,725 B2
(45) Date of Patent: Aug. 14, 2007

(54) RESISTOR LADDER INTERPOLATION FOR SUBRANGING ADC

(75) Inventor: Jan Mulder, Houten (NL)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 11/651,454

(22) Filed: Jan. 10, 2007

(65) Prior Publication Data
US 2007/0109173 A1 May 17, 2007

Related U.S. Application Data

(60) Division of application No. 11/084,236, filed on Mar. 21, 2005, now Pat. No. 7,190,298, which is a continuation-in-part of application No. 10/926,407, filed on Aug. 26, 2004, which is a continuation-in-part of application No. 10/748,250, filed on Dec. 31, 2003, now Pat. No. 6,784,818, which is a continuation of application No. 10/158,774, filed on May 31, 2002, now Pat. No. 6,697,005, which is a continuation-in-part of application No. 10/153,709, filed on May 24, 2002, now Pat. No. 6,628,224.

(51) Int. Cl.
*H03M 1/12* (2006.01)
(52) U.S. Cl. .................. 341/172; 341/122; 341/156; 341/155; 341/154
(58) Field of Classification Search ............ 341/118, 341/120, 122, 155, 156
See application file for complete search history.

(56) References Cited

U.S. PATENT DOCUMENTS

| | | | |
|---|---|---|---|
| 3,697,978 A | 10/1972 | Prill | |
| 3,798,557 A | 3/1974 | Scott et al. | |
| 3,846,712 A | 11/1974 | Kiko | |
| 4,350,975 A * | 9/1982 | Haque et al. | 341/108 |
| 4,385,286 A * | 5/1983 | Haque | 341/108 |
| 4,462,021 A | 7/1984 | Watanabe et al. | |

(Continued)

FOREIGN PATENT DOCUMENTS

EP 0 482 288 A1 4/1992

(Continued)

OTHER PUBLICATIONS

Cho, T.B. and Gray, P.R., "A 10 b, 20 Msample/s, 35 mW Pipline A/D Converter," IEEE Journal of Solid-State Circuits, IEEE, vol. 30, No. 3, Mar. 1995, pp. 166-172.

(Continued)

*Primary Examiner*—Linh Nguyen
(74) *Attorney, Agent, or Firm*—Sterne, Kessler, Goldstein & Fox P.L.L.C.

(57) ABSTRACT

An analog to digital converter includes a resistive ladder outputting a plurality of reference voltages and a coarse ADC receiving the reference voltages and a voltage input. A plurality of coarse comparators receive an output of the coarse ADC. A switch matrix receives an output of the coarse ADC and the reference voltages. The switch matrix inputs a plurality of control signals for selecting at least two voltage subranges. A fine ADC receives the two voltage subranges and the voltage input. A plurality of fine comparators receive an output of the fine ADC. An encoder converts outputs of the coarse and fine comparators to a digital representation of the voltage input. The voltage subranges are adjacent. Each control signal includes a plurality of control lines for controlling corresponding switches. The switches are field effect transistors.

5 Claims, 15 Drawing Sheets

U.S. PATENT DOCUMENTS

| | | | |
|---|---|---|---|
| 4,507,649 A | 3/1985 | Dingwall et al. | |
| 4,831,379 A | 5/1989 | Van de Plassche | |
| 4,959,563 A | 9/1990 | Schenck | |
| 5,006,727 A | 4/1991 | Ragosch et al. | |
| 5,118,971 A | 6/1992 | Schenck | |
| 5,157,397 A | 10/1992 | Vernon | |
| 5,164,728 A | 11/1992 | Matsuzawa et al. | |
| 5,191,336 A | 3/1993 | Stephenson | |
| 5,235,333 A * | 8/1993 | Naylor et al. | 341/118 |
| 5,302,869 A | 4/1994 | Hosotani et al. | |
| 5,376,937 A | 12/1994 | Colleran et al. | |
| 5,389,928 A | 2/1995 | Coppero et al. | |
| 5,396,245 A | 3/1995 | Rempfer | |
| 5,422,642 A | 6/1995 | Chung et al. | |
| 5,471,210 A | 11/1995 | Wingender et al. | |
| 5,539,406 A | 7/1996 | Kouno et al. | |
| 5,554,943 A | 9/1996 | Moreland | |
| 5,581,255 A | 12/1996 | Hsu | |
| 5,682,163 A | 10/1997 | Hsu | |
| 5,726,653 A | 3/1998 | Hsu et al. | |
| 5,745,067 A | 4/1998 | Chou et al. | |
| 5,859,606 A | 1/1999 | Schrader et al. | |
| 5,867,116 A | 2/1999 | Nakamura et al. | |
| 5,923,277 A | 7/1999 | Takeda | |
| 5,969,657 A | 10/1999 | Dempsey et al. | |
| 5,973,632 A | 10/1999 | Tai | |
| 6,091,352 A | 7/2000 | Morisson | |
| 6,121,912 A | 9/2000 | Brandt | |
| 6,169,502 B1 | 1/2001 | Johnson et al. | |
| 6,175,323 B1 | 1/2001 | Flynn | |
| 6,246,351 B1 | 6/2001 | Yilmaz | |
| 6,246,352 B1 | 6/2001 | Fattaruso et al. | |
| 6,259,745 B1 | 7/2001 | Chan | |
| 6,268,819 B1 | 7/2001 | Fattaruso et al. | |
| 6,271,784 B1 * | 8/2001 | Lynn et al. | 341/150 |
| 6,288,666 B1 * | 9/2001 | Afghahi et al. | 341/158 |
| 6,346,902 B1 | 2/2002 | Venes et al. | |
| 6,400,300 B1 | 6/2002 | Leung et al. | |
| 6,459,400 B1 | 10/2002 | Steinbach | |
| 6,489,913 B1 | 12/2002 | Hansen et al. | |
| 6,518,898 B1 | 2/2003 | Choksi | |
| 6,570,523 B1 | 5/2003 | Bacrania et al. | |
| 6,573,853 B1 | 6/2003 | Mulder | |
| 6,583,747 B1 | 6/2003 | van der Goes et al. | |
| 6,590,518 B1 | 7/2003 | Taft | |
| 6,614,379 B2 | 9/2003 | Lin et al. | |
| 6,628,224 B1 | 9/2003 | Mulder et al. | |
| 6,642,866 B2 | 11/2003 | Kuo et al. | |
| 6,653,966 B1 | 11/2003 | Van er Goes et al. | |
| 6,664,910 B1 | 12/2003 | Mulder et al. | |
| 6,674,388 B2 | 1/2004 | Mulder | |
| 6,697,005 B2 | 2/2004 | Mulder | |
| 6,714,886 B2 | 3/2004 | Sung et al. | |
| 6,720,798 B2 | 4/2004 | Mulder et al. | |
| 6,720,901 B2 | 4/2004 | Nakamoto | |
| 6,784,818 B2 | 8/2004 | Mulder | |
| 6,788,238 B2 | 9/2004 | Mulder | |
| 6,831,585 B2 | 12/2004 | Mulder et al. | |
| 6,867,621 B2 | 3/2005 | Mulder et al. | |
| 6,888,483 B2 | 5/2005 | Mulder | |
| 6,937,178 B1 | 8/2005 | Rempfer et al. | |
| 6,956,413 B2 | 10/2005 | Bailey | |
| 6,958,720 B1 | 10/2005 | Prater | |
| 6,977,603 B1 | 12/2005 | Barna et al. | |
| 7,190,298 B2 | 3/2007 | Mulder | |
| 2005/0068216 A1 | 3/2005 | Mulder et al. | |
| 2005/0162299 A1 | 7/2005 | Mulder | |

OTHER PUBLICATIONS

Choe, M.-J. et al., "A 13-b 40-Msample/s CMOS Piplined Folding ADC with Background Offset Trimming," IEEE Journal of Solid-State Circuits, IEEE, vol. 35, No. 12, Dec. 2000, pp. 1781-1790.

Choi, M. and Abidi, A., "A 6-b 1.3-Gsample/s A/D Converter in 0.35-μm CMOS," IEEE Journal of Solid-State Circuits, IEEE, Vol. 36, No. 12, Dec. 2001, pp. 1847-1858.

Dingwall et al., "An 8-MHz CMOS Subranging 8-Bit A/D Converter," *IEEE Journal of Solid-State Circuits*, vol. SC-20, No. 6, Dec. 1985, pp. 1138-1143.

Flynn, M. and Sheahan, B., "A 400-Msample/s, 6-b CMOS Folding and Interpolating ADC," IEEE Journal of Solid-State Circuits, IEEE, vol. 33, No. 12, Dec. 1998, pp. 1932-1938.

Geelen, G., "A 6b 1.1GSamples/s CMOS A/D Converter," IEEE International Solid-State Circuits Conference, IEEE, 2001, pp. 128-129 and 438.

Hoogzaad, G. and Roovers, R., "A 65-mW, 10-bit, 40-Msample/s BiCMOS Nyquist ADC in 0.8 mm*," IEEE Journal of Solid-State Circuits, IEEE, vol. 34, No. 12, Dec. 1999, pp. 1796-1802.

Hosotani, S. et al., "An 8-bit 20-MS/s CMOS A/D Converter with 50-mW Power Consumption," IEEE Journal of Solid-State Circuits, IEEE, vol. 25, No. 1, Feb. 1990, pp. 167-172.

Ingino, J. and Wooley, B., "A Continuously Calibrated 12-b, 10-MS/s, 3.3-V A/D Converter," *IEEE Journal of Solid-State Circuits*, IEEE, vol. 33, No. 12, Dec. 1998, pp. 1920-1931.

Ito, M. et al., "A 10 bit 20 MS/s 3 V Supply CMOS A/D Converter," IEEE Journal of Solid-State Circuits, IEEE, vol. 29, No. 12, Dec. 1994, pp. 1531-1536.

Kattman, K. and Barrow, J., "A Technique for Reducing Differential Non-Linearity Errors in Flash A/D Converters," IEEE International Solid-State Conference, IEEE, 1991, pp. 170-171.

Kusumoto, K. et al., "A 10-b 20-MHz 30-mW Pipelined Interpolating CMOS ADC," IEEE Journal of Solid-State Circuits, IEEE, vol. 28, No. 12, Dec. 1993, pp. 1200-1206.

Lewis, S. et al., "A 10-b 20-Msample/s Analog-to-Digital Converter," IEEE Journal of Solid-State Circuits, IEEE, vol. 27, No. 3, Mar. 1992, pp. 351-358.

Mehr, I. and Singer, L., "A 55-mW, 10-bit, 40-Msample/s Nyquist-Rate CMOS ADC," IEEE Journal of Solid-State Circuits, IEEE, vol. 35, No. 3, Mar. 2000, pp. 318-325.

Miyazaki et al., ISSCC 2002/Session 10/High-Speed ADCs/10.5, "A 16mW 30MSample/s 10b Pipelined A/D Converter using a Psuedo-Differential Architecture", Feb. 5, 2002, 3 pgs.

Nagaraj, K. et al., "A Dual-Mode 700-Msamples/s 6-bit 200-Msamples/s 7-bit A/D Converter in a 0.25-μm Digital CMOS," IEEE Journal of Solid-State Circuits, IEEE, vol. 35, No. 12, Dec. 2000, pp. 1760-1768.

Nagaraj, K. et al., "Efficient 6-Bit A/D Converter Using a 1-Bit Folding Front End," IEEE Journal of Solid-State Circuits, IEEE, vol. 34, No. 8, Aug. 1999, pp. 1056-1062.

Nauta, B. and Venes, A., "A 70-MS/s 110-mW CMOS Folding and Interpolating A/D Converter," IEEE Journal of Solid-State Circuits, IEEE, vol. 30, No. 12, Dec. 1995, pp. 1302-1308.

Pan, H. et al., "A 3.3-V 12-b 50-MS/s A/D Converter in 0.6-μm CMOS with over 80-dB SFDR," IEEE Journal of Solid-State Circuits, IEEE, vol. 35, No. 12, Dec. 2000, pp. 1769-1780.

Song, W-C. et al., "A 10-b 20-Msample/s Low-Power CMOS ADC," IEEE Journal of Solid-State Circuits, IEEE, vol. 30, No. 5, May 1995, pp. 514-521.

Sumanen, L. et al., "A 10-bit 200-MS/s CMOS Parallel Pipeline A/D Converter," IEEE Journal of Solid-State Circuits, IEEE, vol. 36, No. 7, Jul. 2001, pp. 1048-1055.

Sushihara et al., "A 7b 450Msample/s 50mW CMOS ADC in 0.3 mm$^2$," *IEEE International Solid-State Circuits Conference 2000*, IEEE, Feb. 5, 2002, 3 pages.

Taft, R.C. and Tursi, M.R., "A 100-MS/s 8-b CMOS Subranging ADC with Sustained Parametric Performance from 3.8 V Down to 2.2 V," IEEE Journal of Solid-State Circuits, IEEE, vol. 36, No. 3, Mar. 2001, pp. 331-338.

Van Der Ploeg, H. and Remmers, R., "A 3.3-V, 10-b 25-Msample/s Two-Step ADC in 0.35-μm CMOS," IEEE Journal of Solid-State Circuits, IEEE, vol. 34, No. 12, Dec. 1999, pp. 1803-1811.

Van Der Ploeg, H. et al., "A 2.5-V 12-b 54-Msample/s 0.25-<m CMOS ADC in 1-mm< With Mixed-Signal Chopping and Calibration," IEEE Journal of Solid-State Circuits, IEEE, vol. 36, No. 12, Dec. 2001, pp. 1859-1867.

Vorenkamp, P. and Roovers, R., "A 12-b, 60-Msample/s Cascaded Folding and Interpolating ADC," IEEE Journal of Solid-State Circuits, IEEE, vol. 32, No. 12, Dec. 1997, pp. 1876-1886.

Wang, Y-T. and Razavi, B., "An 8-bit 150-MHz CMOS A/D Converter," IEEE Journal of Solid-State Circuits, IEEE, vol. 35, No. 3, Mar. 2000, pp. 308-317.

Yotsuyanagi, M. et al., "A 2 V, 10 b, 20 Msample/s, Mixed-Mode Subranging CMOS A/D Converter," IEEE Journal of Solid-State Cicuits, IEEE, vol. 30, No. 12, Dec. 1995, pp. 1533-1537.

Yu, P.C. and Lee, H-S., "A 2.5-V, 12-b, 5-Msample/s Pipelined CMOS ADC," IEEE Journal of Solid-State Circuits, IEEE, vol. 31, No. 12, Dec. 1996, pp. 1854-1861.

Abo, A.M. and Gray, P.R., "A 1.5-V, 10-bit, 14.3-MS/s CMOS Pipline Analog-to-Digital Converter," IEEE Journal of Solid-State Circuits, IEEE, vol. 34, No. 5, May 1999, pp. 599-606.

Brandt, B.P. and Lutsky, J., "A 75-mW, 10-b, 20-MSPS CMOS Subranging ADC with 9.5 Effective Bits at Nyquist," IEEE Journal of Solid-State Circuits, IEEE, vol. 34, No. 12, Dec. 1999, pp. 1788-1795.

Bult, Klaas and Buchwald, Aaron, "An Embedded 240-mW 10-b 50-MS/s CMOS ADC in 1-mmÿ," IEEE Journal of Solid-State Circuits, IEEE, vol. 32, No. 12, Dec. 1997, pp. 1887-1895.

* cited by examiner

RESISTOR LADDER INTERPOLATION FOR SUBRANGING ADC

CROSS-REFERENCE TO RELATED APPLICATIONS

This application is a Divisional of Application No. 11/084,236, Filed: Mar. 21, 2005, now U.S. Pat. No. 7,190, 298, Titled: RESISTOR LADDER INTERPOLATION FOR SUBRANGING ADC, which is a Continuation-in-Part of Application Ser. No. 10/926,407, Filed: Aug. 26, 2004 Titled: RESISTOR LADDER INTERPOLATION FOR PGA AND DAC, which is a Continuation-in-Part of Application Ser. No. 10/748,250, Filed: Dec. 31, 2003, now U.S. Pat. No. 6,784,818. Issued: Aug. 31, 2004. Titled: ANALOG TO DIGITAL CONVERTER WITH INTERPOLATION OF REFERENCE LADDER, which is a Continuation of Application Ser. No. 10/158,774, Filed: May 31, 2002, now U.S. Pat. No. 6,697,005, Issued: Feb. 24, 2004, Titled: ANALOG TO DIGITAL CONVERTER WITH INTERPOLATION OF REFERENCE LADDER, which is a Continuation-in-Part of Application Ser. No. 10/153,709, Filed: May 24, 2002, now U.S. Pat. No. 6,628,224, Issued: Sep. 30, 2003, Titled: DISTRIBUTED AVERAGING ANALOG To DIGITAL CONVERTER TOPOLOGY, all of which are incorporated by reference herein.

BACKGROUND OF THE INVENTION

1. Field of the Invention

The present invention relates to reference ladders, and more particularly, to interpolation of reference ladder voltages for use in analog to digital converters (ADCs) programmable gain amplifiers (PGAs) and digital to analog converters (DACs).

2. Related Art

A subranging analog to digital converter (ADC) architecture is suitable for implementing high-performance ADC's (i.e. high speed, low power, low area, high resolution). FIG. 1 shows the generic two-step subranging architecture, comprising a reference ladder 104, a coarse ADC 102, a switching matrix 103, a fine ADC 105, coarse comparators 107, fine comparators 108 and an encoder 106. In most cases, a track-and-hold 101 is used in front of the ADC. In this architecture, an input voltage is first quantized by the coarse ADC 102. The coarse ADC 102 compares the input voltage against all the reference voltages, or against a subset of the reference voltages that is uniformly distributed across the whole range of reference voltages. Based on a coarse quantization, the switching matrix 103 connects the fine ADC 105 to a subset of the reference voltages (called a "subrange") that is centered around the input signal voltage.

A flash ADC architecture is the most straightforward implementation of an analog-to-digital converter. Unfortunately, it is very inefficient in terms of area and power. In particular, an N-bit ADC requires $2^N$ comparators. Furthermore, it requires a reference ladder with $2^N$ taps, which generally causes a lot of wiring parasitic capacitance, slowing down the ADC.

A subranging ADC architecture is often used as a more power- and area-efficient alternative to the flash ADC architecture. While subranging does help to reduce the number of comparators, it does not help to reduce the number of taps on the reference ladder. In fact, the situation is complicated by the fact that subranging requires a switching matrix with a large number of switches. Parasitic capacitance associated with these switches slows down the ADC even further.

A conventional way of connecting the first row of amplifiers to the reference ladder is shown in FIG. 2: amplifier A1 connects to reference taps "2m" and "0", amplifier A2 connects to a "2m−1" tap and a "1 " tap, etc. Thus, in a "brute force" flash ADC, the reference ladder 104 has $2^N$=2m taps (e.g., 1024 taps for N=10).

Three techniques have been published in the literature for decreasing the number of switches in subranging ADC's. First, interpolation between preamplifier output voltages is often used. Interpolation is often applied in both flash ADC's, subranging ADC's and folding ADC's. This form of interpolation reduces the number of amplifiers in a first array of amplifiers. Since only the first array of amplifiers needs connections to the reference ladder 104, this technique reduces the required number of reference taps and switches. For example, 4×interpolation within the fine ADC 105 reduces the number of switches by 75%.

A second technique for reducing the number of switches is referred to as "absolute value processing." See B. P. Brandt and J. Lutsky. "A 75-mW, 10-b, 20-MSPS CMOS subranging ADC with 9.5 effective bits at Nyquist, " *IEEE Jour. of Solid State Circ.,* 34(12):1788-1795 (December 1999). This technique uses the fact that the absolute value function can be implemented simply by a commutator, basically comprising only four switches. This technique reduces the required number of switches in the matrix 103 by another 50%. Note that this technique does not reduce the number of taps on the reference ladder 104.

A third technique called "multilevel tree decoding scheme" decreases the number of switches by 62.5%. (See, e.g., Ito et al., "A 10-bit 20 MS/s 3V Supply CMOS A/D converter," *IEEE J of Solid State Circ.,* 29 (12):1532-36, December 1994) Note that this technique does not reduce the number of taps on the reference ladder 104.

For example, a 10-bit analog digital converter in a "brute force" flash type configuration would require $2^{10}$, or 1024 taps on the reference ladder, which is very awkward. Thus, the problem involves the total number of taps required from the reference ladder, as well as the number of switches in the switch matrix for a subranging analog digital converter. It is therefore desirable to reduce the number of taps, which reduces the amount of parasitic capacitance due to the connections involved.

Accordingly, a need exists for an ADC circuit topology that significantly reduces the number of switches and taps from the reference ladder 104.

SUMMARY OF THE INVENTION

The present invention is directed to resistor ladder interpolation for subranging ADC that substantially obviates one or more of the problems and disadvantages of the related art.

To achieve these and other advantages and in accordance with the purpose of the present invention, as embodied and broadly described, there is provided an analog to digital converter including a resistive ladder outputting a plurality of reference voltages and a coarse ADC receiving the reference voltages and a voltage input. A plurality of coarse comparators receive an output of the coarse ADC. A switch matrix receives an output of the coarse ADC and the reference voltages. The switch matrix inputs a plurality of control signals for selecting at least two voltage subranges. A fine ADC receives the two voltage subranges and the voltage input. A plurality of fine comparators receive an output of the fine ADC. An encoder converts outputs of the coarse and fine comparators to a digital representation of the voltage input. The voltage subranges are adjacent. Each control signal includes a plurality of control lines for controlling corresponding switches. The switches are field effect transistors.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

One of the disadvantages of the subranging ADC architecture is the large number of switches required, resulting in degraded high-frequency performance. This disclosure describes how the required number of switches can be significantly reduced by interpolation of the reference ladder. Three new interpolation techniques are proposed.

All three techniques accomplish interpolation of the reference ladder taps. Since all three techniques can be applied to both subranging and flash ADC's, for simplicity they will be illustrated with respect to the flash architecture, showing a reduction in reference ladder taps that can be accomplished. Note that for subranging architectures, a reduction in the required number of switches equals a reduction in number of reference taps.

Figure 3:
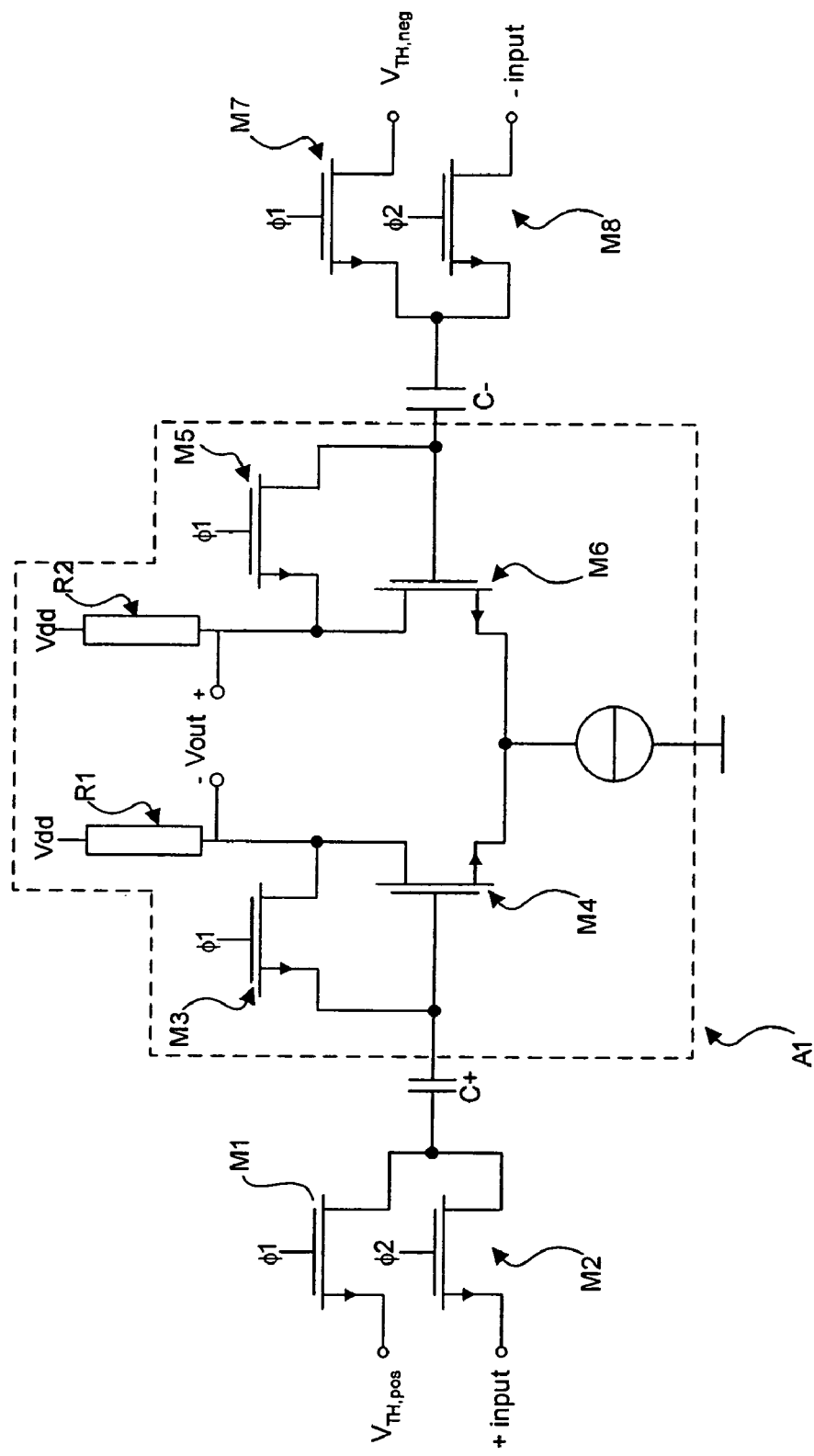
FIG. 3 illustrates an auto-zero amplifier used in the present invention.

The techniques are illustrated based on the auto-zero amplifier shown in FIG. 3. FIG. 3 illustrates the structure of one of the amplifiers in an amplifier array A1, A2, A3 . . . of FIG. 4, discussed below. As shown in FIG. 3, a non-overlapping two-phase clock is used, with non-overlapping phases $\phi_1$ and $\phi_2$. At a "+" input of the amplifier, two NMOS transistors M1 and M2 are used, with a source of the transistor M2 being connected to the "+" input terminal, and a gate of the transistor M2 being connected to the clock phase $\phi_2$. The "+" and "−" inputs are connected to taps from the reference ladder 104.

A gate of the transistor M1 is driven by the clock phase $\phi_1$. The drains of the transistors M1 and M2 are tied together and connected to one side of a capacitor C+. A source of M1 is connected to the positive T/H 101 output, and a source of M7 is connected to the negative T/H 101 output. The gates of M1 and M7 are driven by $\phi_1$. The other side of the capacitor C+ is connected to a source of a transistor M3, and to a gate of a transistor M4. A gate of the transistor M3 is connected to the clock phase $\phi_1$. Drains of the transistors M3 and M4 are tied together and, through resistor R1, to a positive supply voltage $V_{dd}$. A symmetrical structure is used for the "−" input, as shown in FIG. 3, using transistors M8, M7, M6 and M5, and a capacitor C−. The amplifier has differential outputs $V_{OUT+}$, $V_{OUT−}$. The dashed portion corresponds to the amplifier A1 shown in subsequent figures.

During clock phase $\phi_1$ the amplifier is in a reset mode and the sampling capacitors are charged to the value of the sampled voltage $V_{sample}$. More specifically, on $\phi_1$, the transistors M1, M3, M5 and M7 are turned on. During the next clock phase, $\phi_2$, the transistors M2 and M8 are turned on, the amplifier is connected to the reference ladder 104 and the amplifier output voltage $V_{out}$ equals: $V_{out}=G \cdot (V_{ref}-V_{sample})$, where G is the voltage gain of the amplifier, $V_{ref}=V_{+input}-V_{-input}$ and
$V_{sample}=V_{TH, pos}-V_{TH, neg}$, where $V_{TH}$ is the differential output of the track and hold 101.

Figure 1:
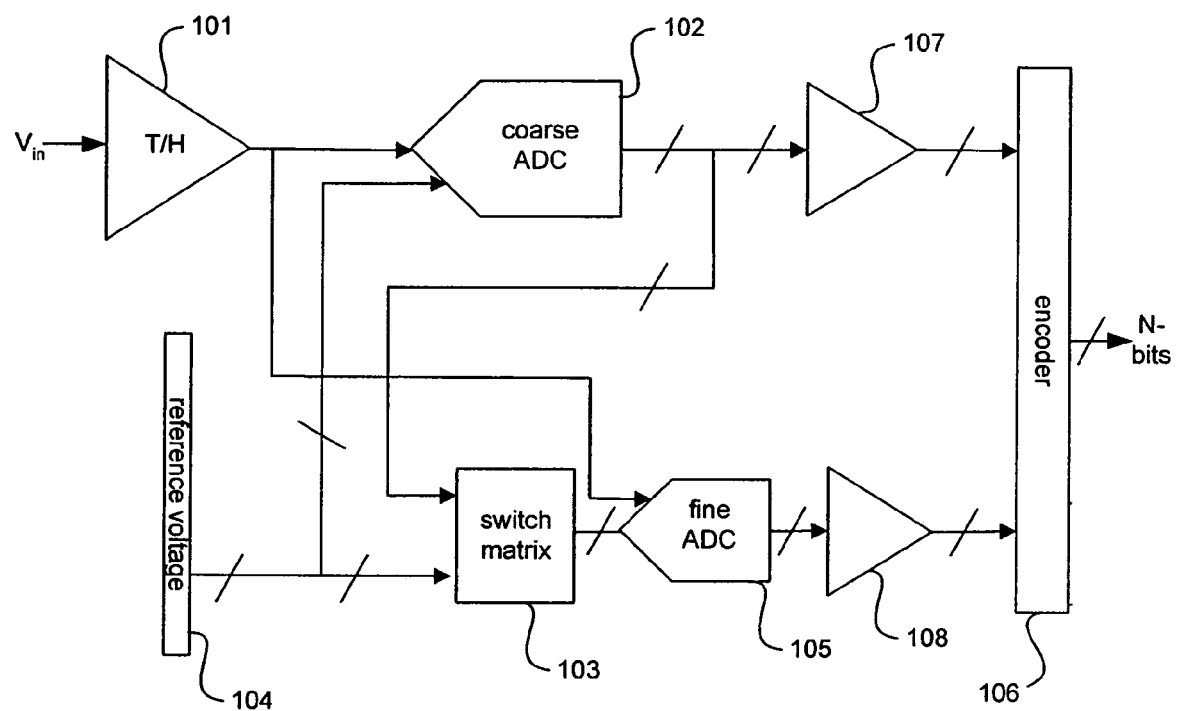
FIG. 1 represents a generalized 2-step subranging an ADC architecture.

It will be appreciated that although the auto-zeroing amplifier of FIG. 3 is shown as using N channel MOSFET's, P channel MOSFET's can also be used. Note further that the track-and-hold 101 of FIG. 1 is typically a differential input and output amplifier that is connected to differential outputs of the track and hold amplifier 110, $V_{TH, pos}$ and $V_{TH, neg}$.

Figure 4:
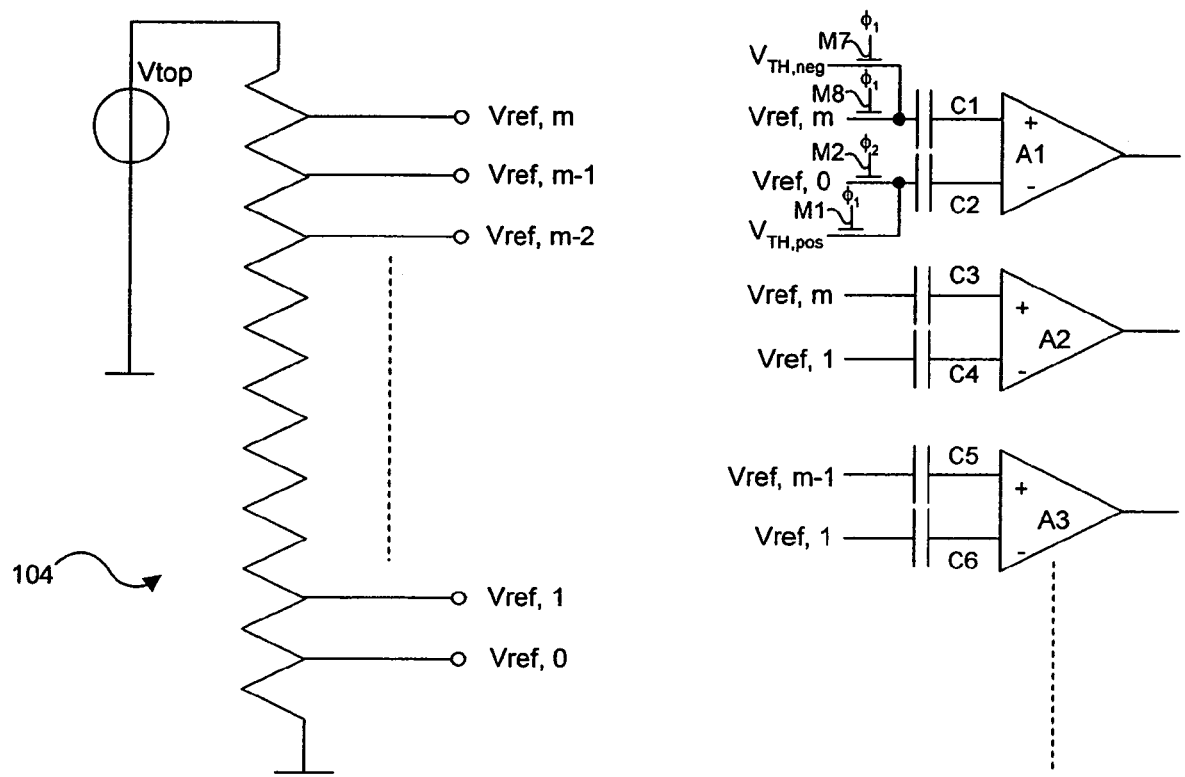
FIG. 4 illustrates a first technique for connecting amplifiers of the present invention to the reference ladder.

FIG. 4 illustrates a first interpolation technique, and shows that about 50% reduction in the number of taps can be obtained if only the positive or the negative reference input is changed when going from one amp to the next. That is, amplifier A1 in FIG. 4 connects to reference taps "m" and "0", amplifier A2 connects to "m" and "1", so that only the negative input changes from A1 to A2; amplifier A3 connects to "m−1" and "1", etc. In other words, a reference ladder 104 has a plurality of taps $V_{ref,0}$ through $V_{ref,m}$. FIG. 4 also shows each of the amplifiers A1, A2, A3 . . . has a capacitor at each input. Thus, the amplifier A1 has a capacitor C1 at its "+" input, and capacitor C2 at its "−" input. The amplifier A2 has capacitor C3 at its "+" input, and capacitor C4 at its "−" input, and so on. The transistors M1, M2, M7 and M8 correspond to the transistors shown in FIG. 3 (and are only shown for the amplifier A1 for clarity). The capacitors C1, C2 correspond to the capacitors C−, C+ of FIG. 3.

As may be seen from FIG. 4, the amplifier A1 is connected to taps $V_{ref,m}$ and $V_{ref,0}$. The amplifier A2 is connected to $V_{ref,m}$ and $V_{ref,1}$. The amplifier A3 is connected to $V_{ref,m-1}$ and $V_{ref,1}$, and so forth. Comparing FIG. 2 with FIG. 4, in FIG. 4, neighboring amplifiers have only one of their inputs changed, compared to neighboring amplifier in FIG. 2, where both of the inputs are changed. In other words, with reference to FIG. 2, in FIG. 2 both the "+" inputs on the amplifiers A1 and A2 change (from $V_{ref,2m}$ to $V_{ref,2m-1}$) as well as the "−" inputs change (from $V_{ref,0}$ to $V_{ref,1}$). In contrast, in FIG. 4, the "+" inputs of the amplifiers A1 and A2 are both the same ($V_{ref,m}$), while the "−" inputs of the amplifiers A1 and A2 change from $V_{ref,0}$ to $V_{ref,1}$. Thus, only one of the inputs changes when going from one amplifier to a neighboring amplifier.

It will be appreciated that the terms "adjacent" and "neighboring" are used in their hierarchical sense compared to the taps from the reference ladder 104, rather than in the sense of how the overall circuit is actually laid out. Thus, although an actual layout would most likely have the amplifiers A1, A2, A3 . . . laid out close to each other, this need not be the case.

Figure 2:
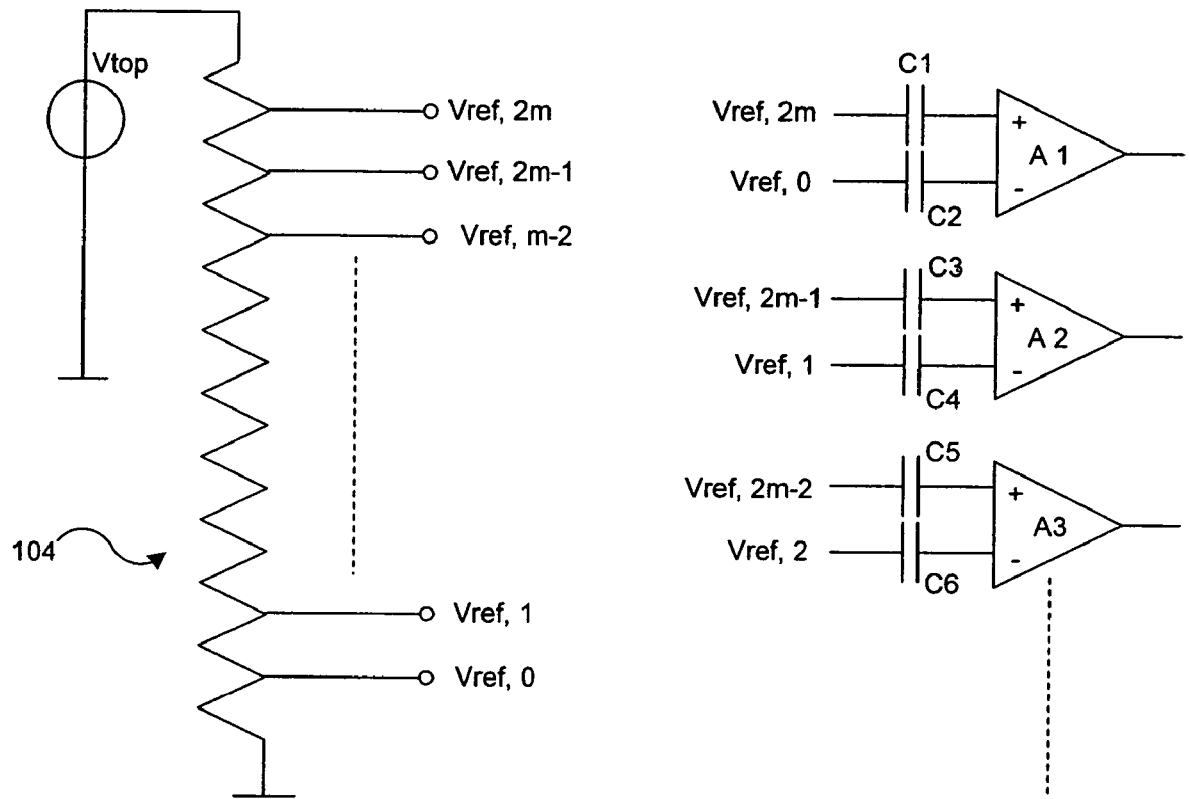
FIG. 2 illustrates a conventional way of connecting a first row of amplifiers to a reference ladder.

It will be appreciated that unlike FIG. 2, which requires a total of 1024 taps for a 10-bit analog digital converter, e.g., $2^N$ in a "brute force" approach, the number of taps required for the circuit of FIG. 4 to operate is half that (or $2^N \div 2$). Note also that the $2^N \div 2$ figure assumes that no interpolation is used.

The proposed technique results in common-mode differences at the inputs of the amplifiers. This is only a minor disadvantage, since the amplifiers generally have good common-mode rejection and the common-mode differences are quite small.

The outputs of the amplifiers (or, if necessary, cascaded stages of amplifiers) are fed into a comparator array (not shown, see 108 of FIG. 1), and then to an encoder (not shown, see 106 of FIG. 1).

Figure 5:
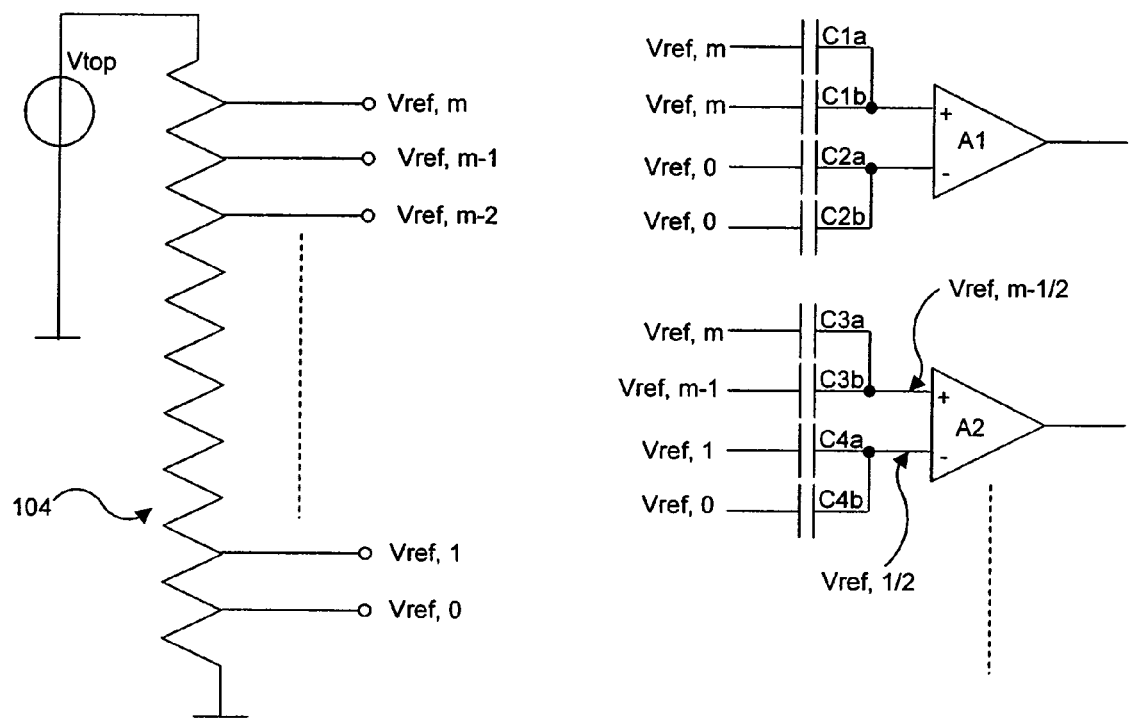
FIG. 5 illustrates the approach of FIG. 4 with split capacitor interpolation.

A second technique accomplishing reference ladder interpolation is illustrated in FIG. 5. Here, the input sampling capacitors C1, C2 . . . of the amplifiers A1, A2, A3 . . . are split into two parts, effectively providing each amplifier with two positive and two negative reference inputs. The capacitor C1 is split up into the capacitors C1a and C1b, and the capacitor C2 is split up into the capacitors C2a and C2b. The capacitor C3 is split up into capacitors C3a and C3b, the capacitor C4 is split up into capacitors C4a and C4b, and so on. The two positive reference inputs can be connected to different reference taps, thus implementing interpolation of the reference ladder 104. The same applies to the two negative reference inputs. As an example, the two positive reference inputs shown in FIG. 5 are connected to taps "m" and "m−1". The "+" input of A2 is effectively connected to a "virtual" tap $V_{ref,m-\frac{1}{2}}$. The "−" input is effectively connected to a "virtual" tap $V_{ref,\frac{1}{2}}$. Thus, this interpolation technique allows an additional reduction of 50% in the number of tap lines from the reference ladder 104.

Note that in terms of circuit layout on a semiconductor substrate, it is easier to split up a capacitor into two smaller capacitors, rather than having more taps from a reference ladder, since the primary source of parasitics is the number of tap lines from the reference ladder 104. A reduction of tap lines therefore results in a reduction in parasitic capacitance associated with the additional tap lines.

It will also be appreciated by one of ordinary skill in the art that the interpolation approach of FIG. 5 does not require that the capacitors at the input of each amplifier be equal. Thus, the interpolation technique will work if each capacitor split up into capacitors having different values, as appropriate for the voltage required at the particular input of the amplifier. It will also be appreciated that each input capacitor can be split up into more than two capacitors, e.g., capacitor C3 may be split up into capacitors C3a, C3b, C3c, although as each capacitor gets smaller, eventually the use of such small capacitors for interpolation will become problematic.

Figure 6:
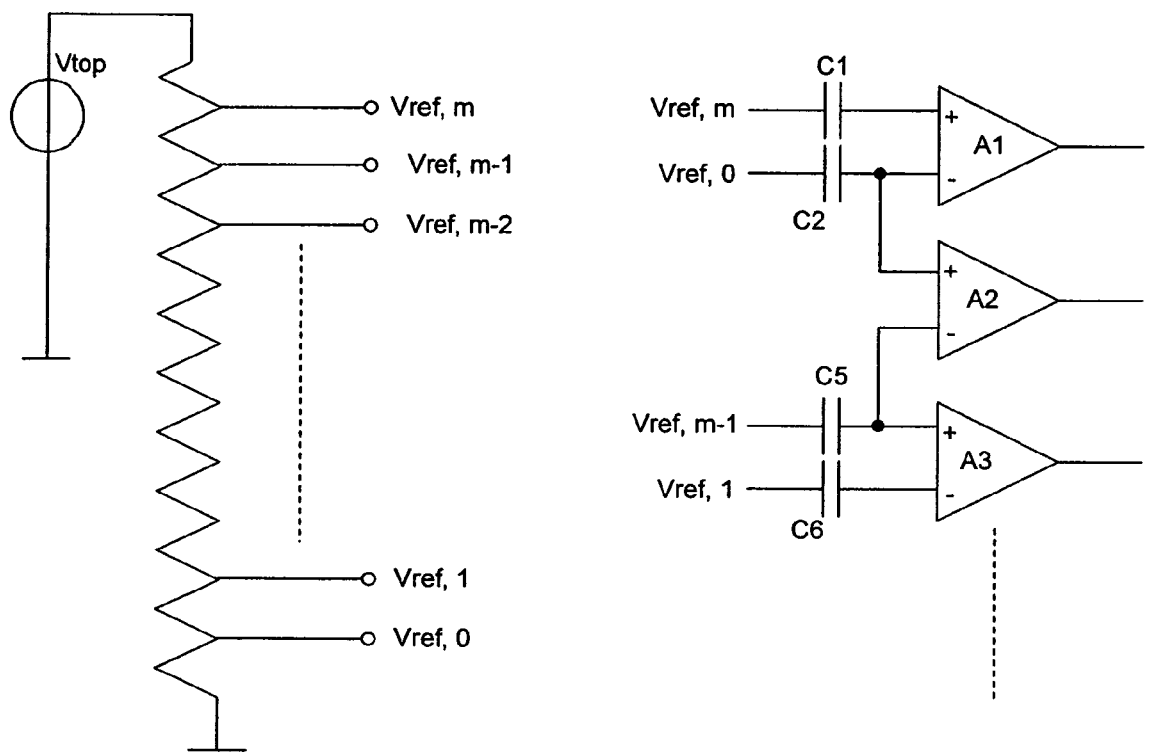
FIG. 6 illustrates the approach of FIG. 5 with interpolation of sampling capacitor outputs.

A third technique accomplishing reference ladder interpolation is illustrated in FIG. 6. FIG. 6 shows that not all input amplifiers need to be connected to the reference taps. Interpolation of the sampling capacitor "outputs" can be used to reduce the required number of reference taps. In the example shown in FIG. 6, a reduction of about 50% is obtained.

As may be seen from FIG. 6, not every amplifier in the amplifier array A1, A2, A3 . . . needs to have its own tap line, particularly where the adjacent, or neighboring, amplifier uses the same tap line. Thus, the "−" input of the amplifier A1, which in FIG. 4 is connected to $V_{ref,0}$ tap, can be directly connected to the "+" input of the amplifier A2, which in FIG. 4 is also connected to the $V_{ref,0}$ tap. Similarly, since the "+" input of A3 and the "−" input of the amplifier A2 are connected to the same voltage $V_{ref,m-1}$ tap, the "−" input of the amplifier A2 does not require its own tap, but can be directly connected to the "+" input of the amplifier A3. This will further reduce the number of tap lines and tap connections from the reference ladder to the amplifier array. The technique shown in FIG. 6 may be referred to as "interpolate by 2" technique, which results in a 50% reduction in the overall number of tap connections. It also results in the elimination of approximately half of the input capacitors, compared to the technique shown in FIG. 4.

Figure 7:
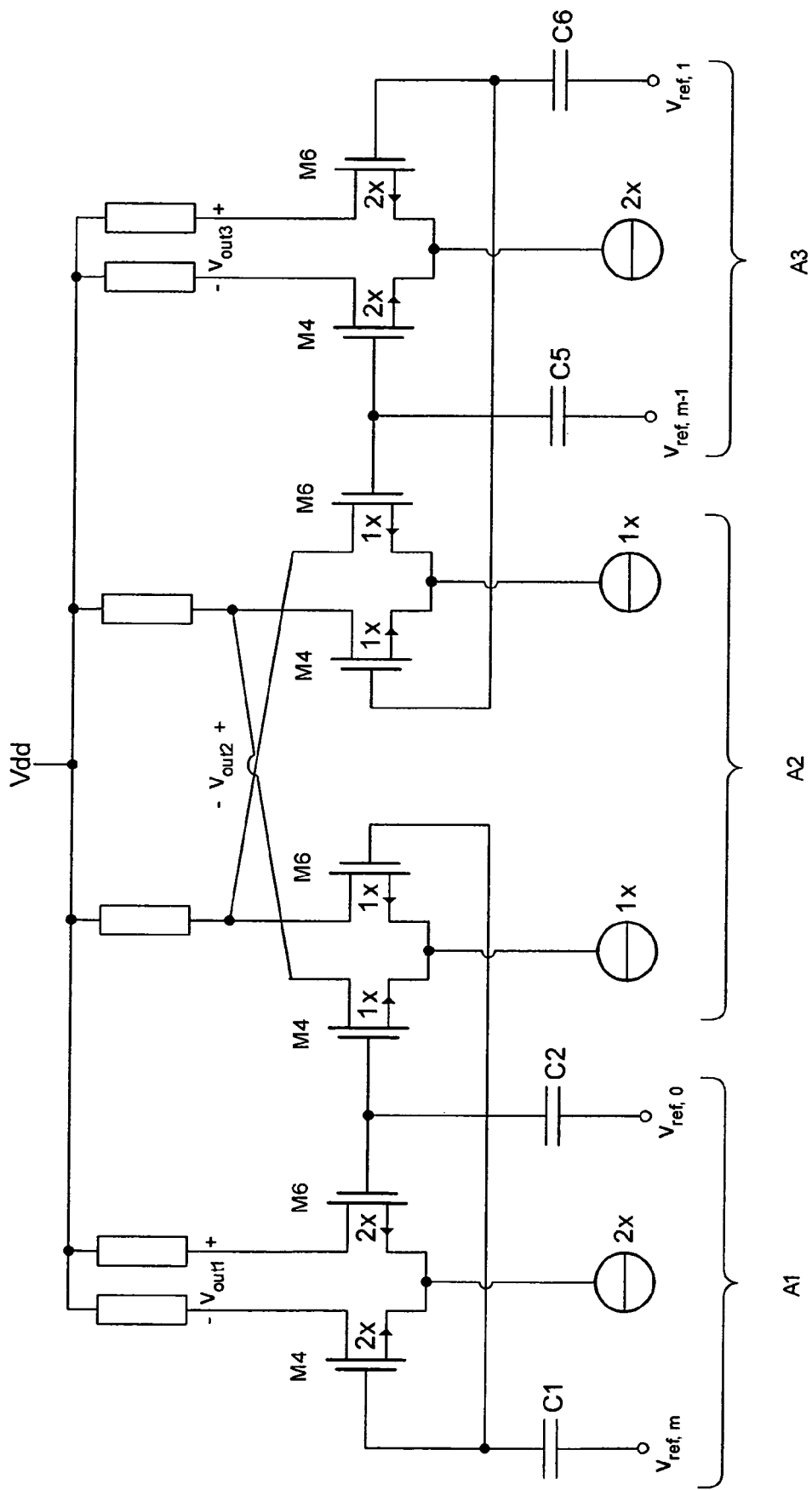
FIG. 7 illustrates a circuit diagram corresponding to the approach of FIG. 6.

FIG. 7 illustrates the approach of FIG. 6 in more detail and shows the three amplifiers A1, A2, A3 of FIG. 6 (without the switches driven by the two phase clock). The A1 and A3 amplifiers have their own input capacitors (C1, C2, and C5, C6, respectively), the A1 amplifier has differential inputs $V_{ref,m}/V_{ref,0}$, the amplifier A3 has differential inputs $V_{ref,m-1}/V_{ref,1}$. The amplifier A2 does not have its own input capacitors. Instead, the amplifier A2 comprises two differential transistor pairs M4, M6 (both half the size of the differential pairs M4, M6 of A1 and A3). It's current sources are each half of the current source of A1 or A3. Gates of one of the transistor pairs M4, M6 connect to the gates of the corresponding transistors of the A1 amplifier, and gates of the other differential transistor pair M4, M6 connect to corresponding gates of transistors of the A3 amplifier. The drain currents of the two differential transistor pairs of A2 are summed. As a result, the output of the amplifier A2 ($V_{OUT,2}$) is (approximately) equal to the average of the outputs of A1 and A3 (i.e., the average of $V_{OUT,1}$ and $V_{OUT,3}$).

The reference ladder interpolation techniques described here can be applied to various types of ADC architectures. In flash and folding ADC architectures, they can be used to reduce the number of taps on the reference ladder 104. In subranging ADC architectures, they reduce both the number of reference taps and the number of switches.

It will be appreciated by one with ordinary skill in the art that techniques described herein are applicable to both flash type ADC's, folding ADC's and subranging ADC's.

Figure 8:
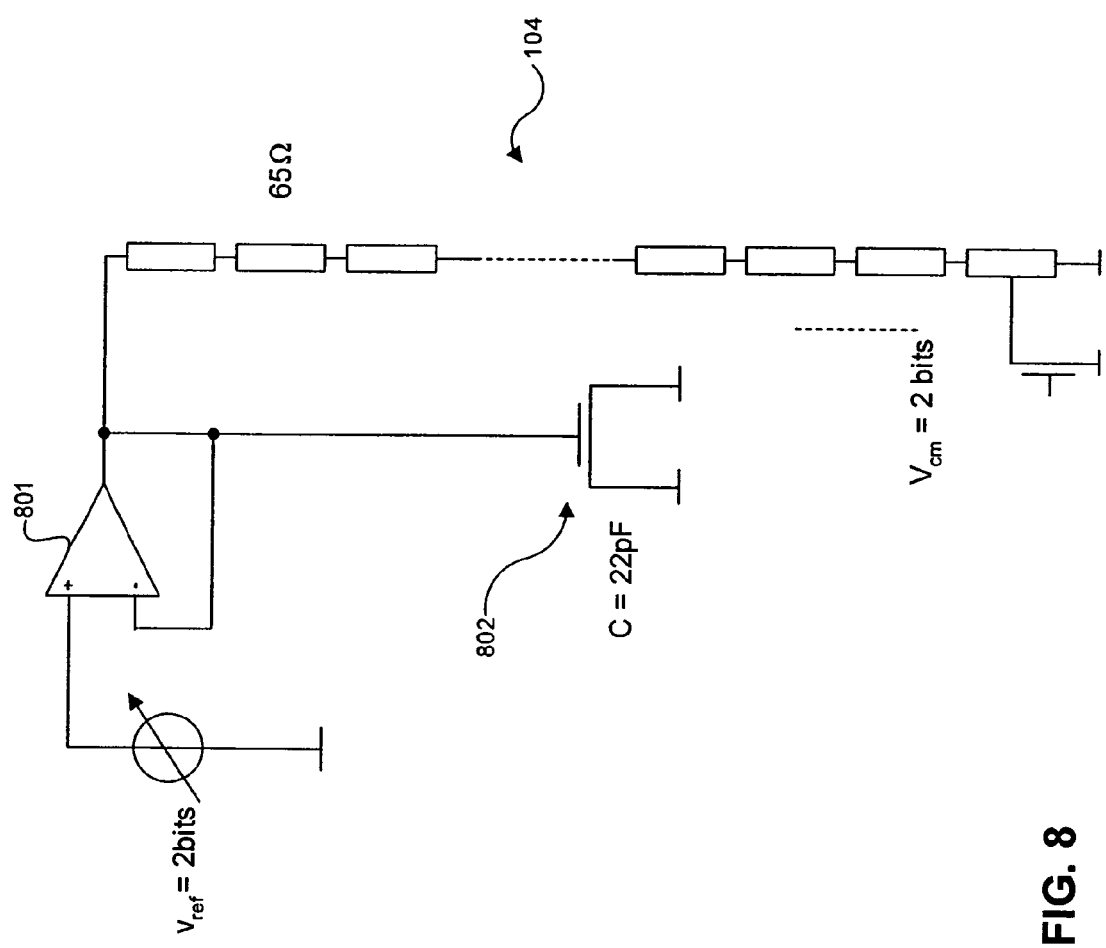
FIG. 8 illustrates a reference ladder used in the present invention.

FIG. 8 illustrates a reference ladder arrangement of one embodiment of the present invention. The reference ladder 104 includes a plurality of 65 Ω resistors which are connected to a relatively slow amplifier 801. (The bandwidth of the amplifier 801 as approximately 1-2 MHz). The output of the amplifier 801 is also tied to its "−" input, and to a transistor 802, whose both source and drain are tied to ground, forming a 22 pF capacitor.

CI three techniques can be applied at the same time, in order to obtain a very significant reduction in the number of reference taps and matrix switches.

For example, for an N=9 bit ADC, the reduction in number of taps is as follows:

| | |
|---|---|
| full flash for N = 9: | 512 taps ($2^N$) |
| 2× capacitive interpolation at ladder: | 256 taps ($2^{N-1}$) |
| change $V_{ref,p}$ or $V_{ref,n}$ only: | 128 taps ($2^{N-2}$) |
| 2× interpolation of the "outputs" of the sampling caps | 64 taps ($2^{N-3}$) |
| 4× split differential pair interpolation: | 16 taps ($2^{N-5}$) |
| edge effect (add one or two): | 17 taps |

The table below illustrates the tap voltages for the 17-tap case:

| Tap # | Tap voltage |
|---|---|
| 16 | 0.95 |
| 15 | 0.90625 |
| 14 | 0.8625 |
| 13 | 0.81875 |
| 12 | 0.775 |
| 11 | 0.73125 |
| 10 | 0.6875 |
| 9 | 0.64375 |
| 8 | 0.6 |
| 7 | 0.55625 |
| 6 | 0.5125 |
| 5 | 0.46875 |
| 4 | 0.425 |
| 3 | 0.38125 |
| 2 | 0.3375 |
| 1 | 0.29375 |
| 0 | 0.25 |

In the description above, a resistive ladder was used for voltage interpolation in the context of analog converters. However, the interpolation approach discussed herein is also applicable to other circuits, for example, programmable gate arrays (PGAs) and digital to analog converters (DACs). The advantage of the approach for PGAs and DACs is the same, i.e., reducing the number of voltage tabs from the resistive ladder, and consequently, reduction in the number of resistors necessary in the resistive ladder. This has the advantage of reducing the amount of real estate on the integrated circuit that is taken up by the resistive ladder.

Figure 9:
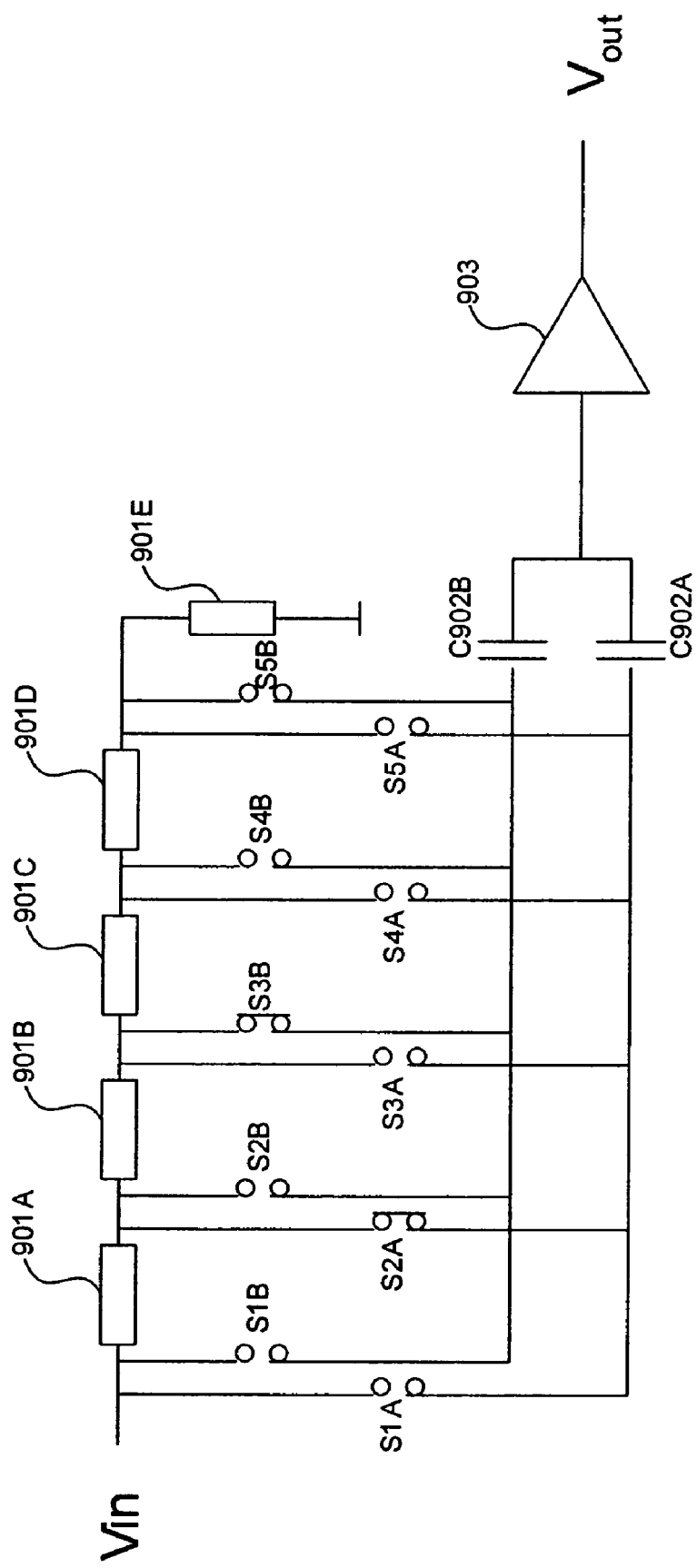
FIG. 9 illustrates capacitive interpolation as applied to a programmable gate array.

FIG. 9 illustrates capacitive interpolation as applied to a programmable gate array. As shown in FIG. 9, a resistive ladder includes five resistors 901A-901E. (It will be appreciated that the invention is not limited to any particular number of resistors in the resistive ladder.) Two capacitors C902A and C902B are at the input of an amplifier 903, which outputs an output voltage $V_{OUT}$. The resistive ladder includes a number of taps, which are connected to the capacitors C902A, C902B through switches S1A, S1B through S5A, S5B, as shown in FIG. 9.

The switches S1A-S5B can be digitally controlled, to result in a large number of possible interpolated voltages, compared to a conventional resistive ladder, which has just the voltage taps (essentially, a resistor divider network). The circuit in FIG. 9 may be viewed as an example of a programmable gain amplifier with a capacitive coupling to a buffer amplifier.

Figure 10:
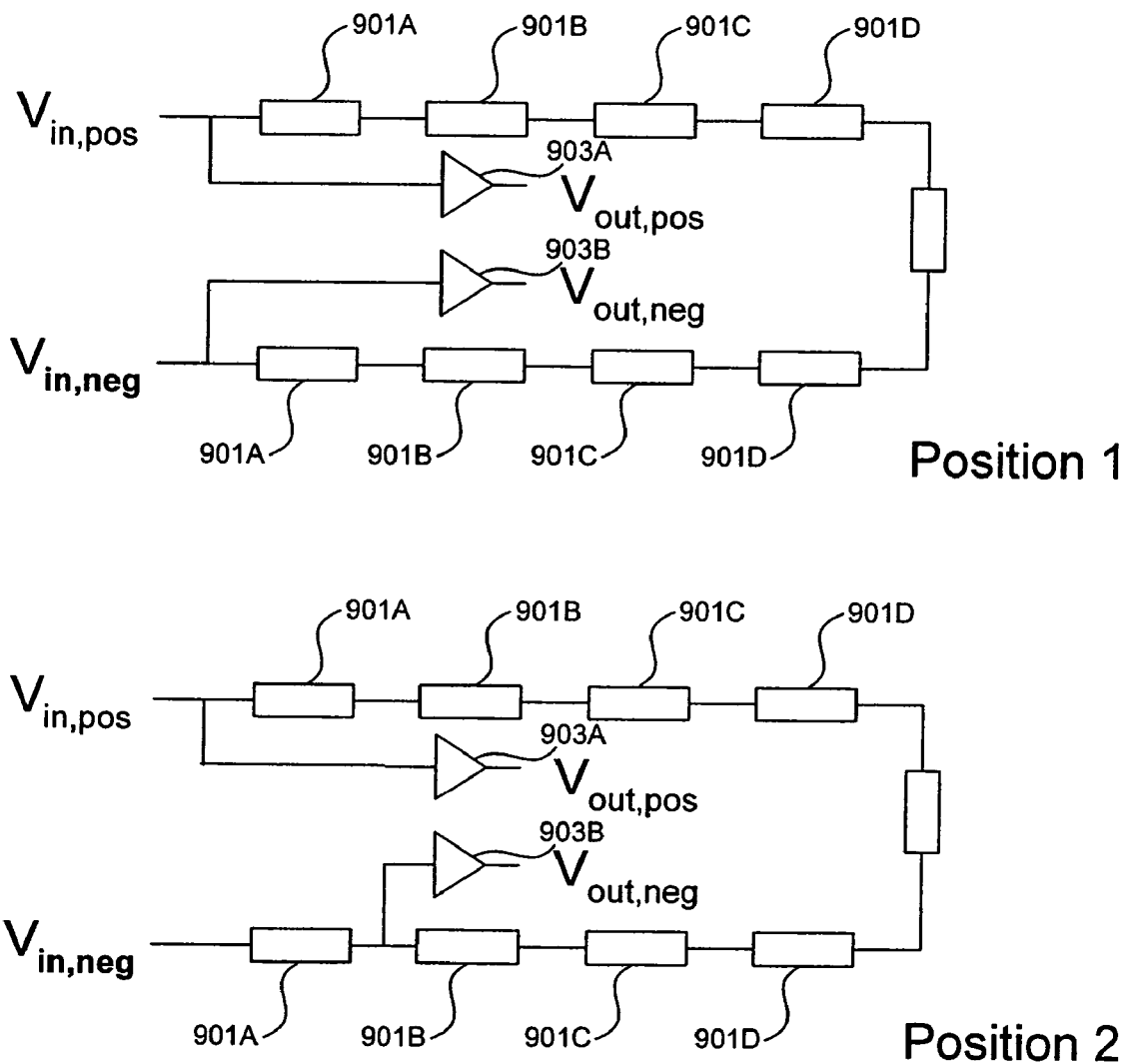
FIG. 10 illustrates an embodiment of interpolation where differential inputs are used.

FIG. 10 illustrates an embodiment of a PGA or a DAC, where differential inputs are used. In essence, two resistive ladders such as shown in FIG. 9, are used in this circuit, one for the positive input $V_{IN,POS}$, and one for the negative input $V_{IN,NEG}$. Two amplifiers 903A, 903B (corresponding to the differential analog of the single amplifier 903 shown in FIG. 9) are used. These amplifiers are connected in the same manner to their respective resistive ladders, as shown in FIG. 9 (these connections are not shown in FIG. 10 for simplicity). As shown in the lower half of FIG. 10, by changing the connections from the taps to the buffer amplifiers 903A, 903B, the output voltages $V_{OUT,POS}$ and $V_{OUT,NEG}$ can be interpolated (in other words, going from a set of connections shown in position 1 to a set of connections shown in position 2 in FIG. 10). In the example shown in FIG. 10, when going from one position to the next, only the "tap" position of the positive or the negative buffer amplifier 903A, 903B is changed. This in effect reduces the number of taps required by a factor of 2. Note that this circuit can be used both in a programmable gain amplifier (when having a varying input signal), or in a DAC (when having a DC reference input signal). In the case of a DAC, the capacitors C902A, C902B would be omitted, since the voltages from the taps are DC voltages.

Figure 11:
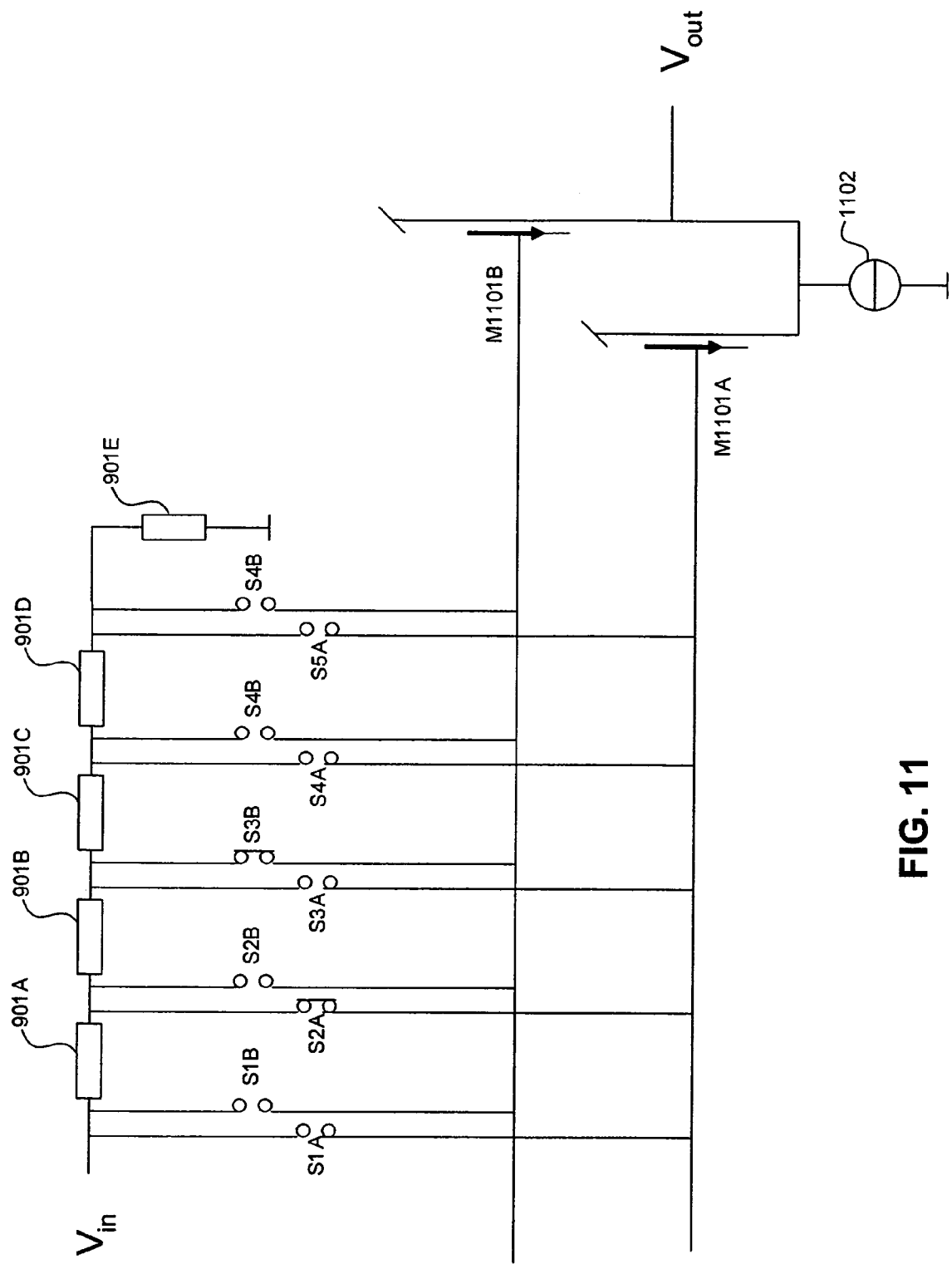
FIG. 11 illustrates an example of active interpolation for a digital to analog converter.

FIG. 11 illustrates an example of active interpolation for a digital to analog converter. Similar to FIG. 9, a resistive ladder comprising a number of resistors (in this case, 901A-901E) is used, with a number of taps between the resistors 901A-901E. The taps are connected through switches S1A-S5B to two transistors M1101A, M11101B (e.g., MOSFET transistors, or bi-polar transistors), as shown in FIG. 11. The switches S1A-S5B are digitally controlled, to be "on" or "off", to provide a particular gate voltage on the gates of the transistors M1101A, M1101B. In the simplest case, only one of the switches is "on", effectively making the resistor ladder a resistor divider. However, by combining several switches, an interpolated voltage may be applied to the gates. A current source 1102 is also used, in combination with the interpolated gate voltages, to generate an interpolated output voltage $V_{OUT}$.

Figure 12:
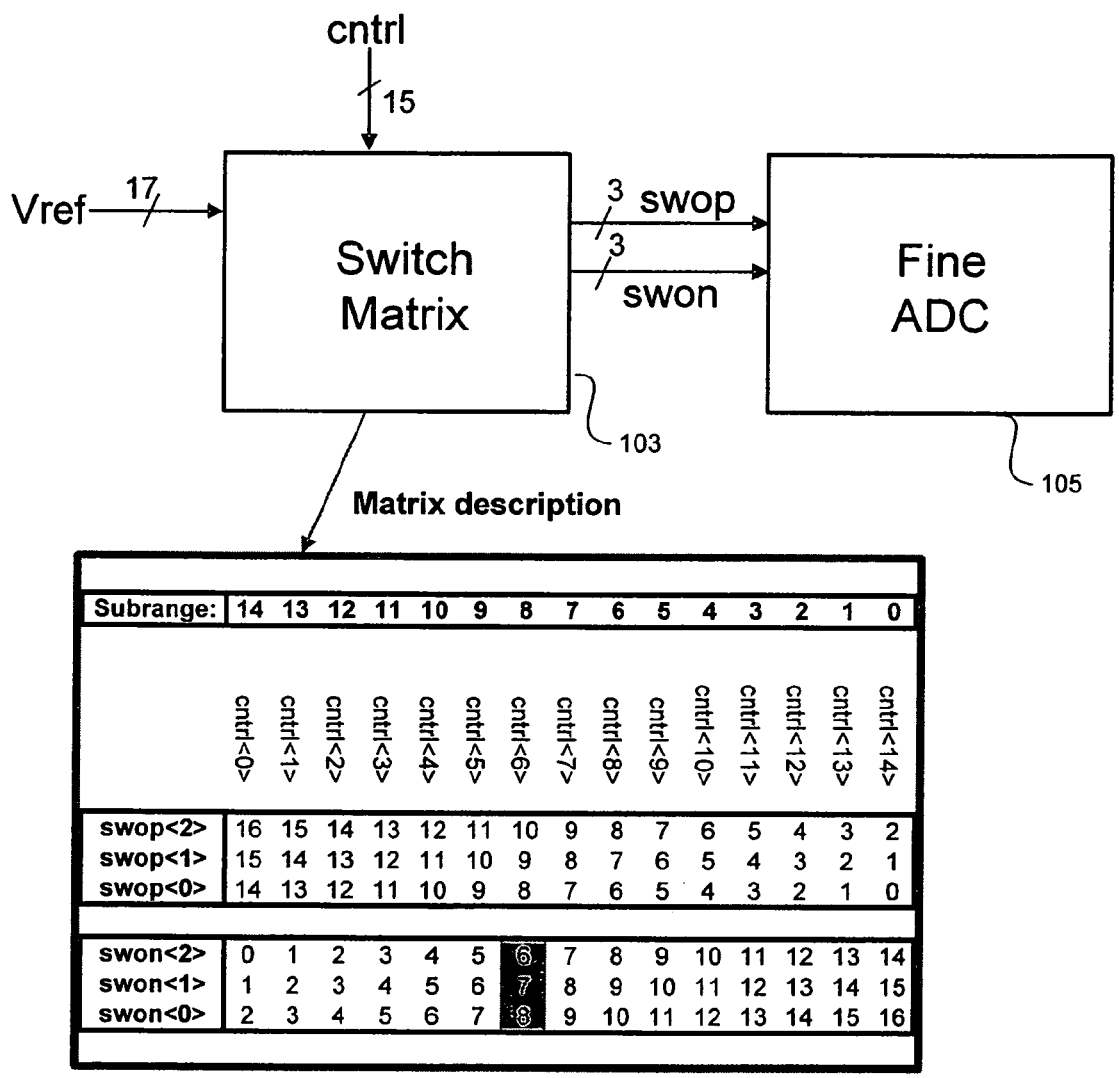
FIGS. 12-13 illustrate a conventional switch matrix used in a subranging ADC.

In the subranging ADC, the 'switch matrix' 103 is essentially a big multiplexer that selects a subset of differential reference voltages (swop-swon) from the set of reference ladder voltages. FIG. 12 illustrates such a conventional switch matrix 103 used in a subranging ADC. For instance, in the 8 bit subranging ADC, 3 different differential reference voltages are selected out of the 17 voltages from the resistor ladder. These selected voltages are used as the reference inputs to the fine ADC 105 of the subranging ADC. The switch matrix 103 is controlled by (in this case) 15 control signals ('cntrl'); during the clock phase that the fine ADC 105 connects to the reference ladder, only one of these control signals is high.

Figure 13:
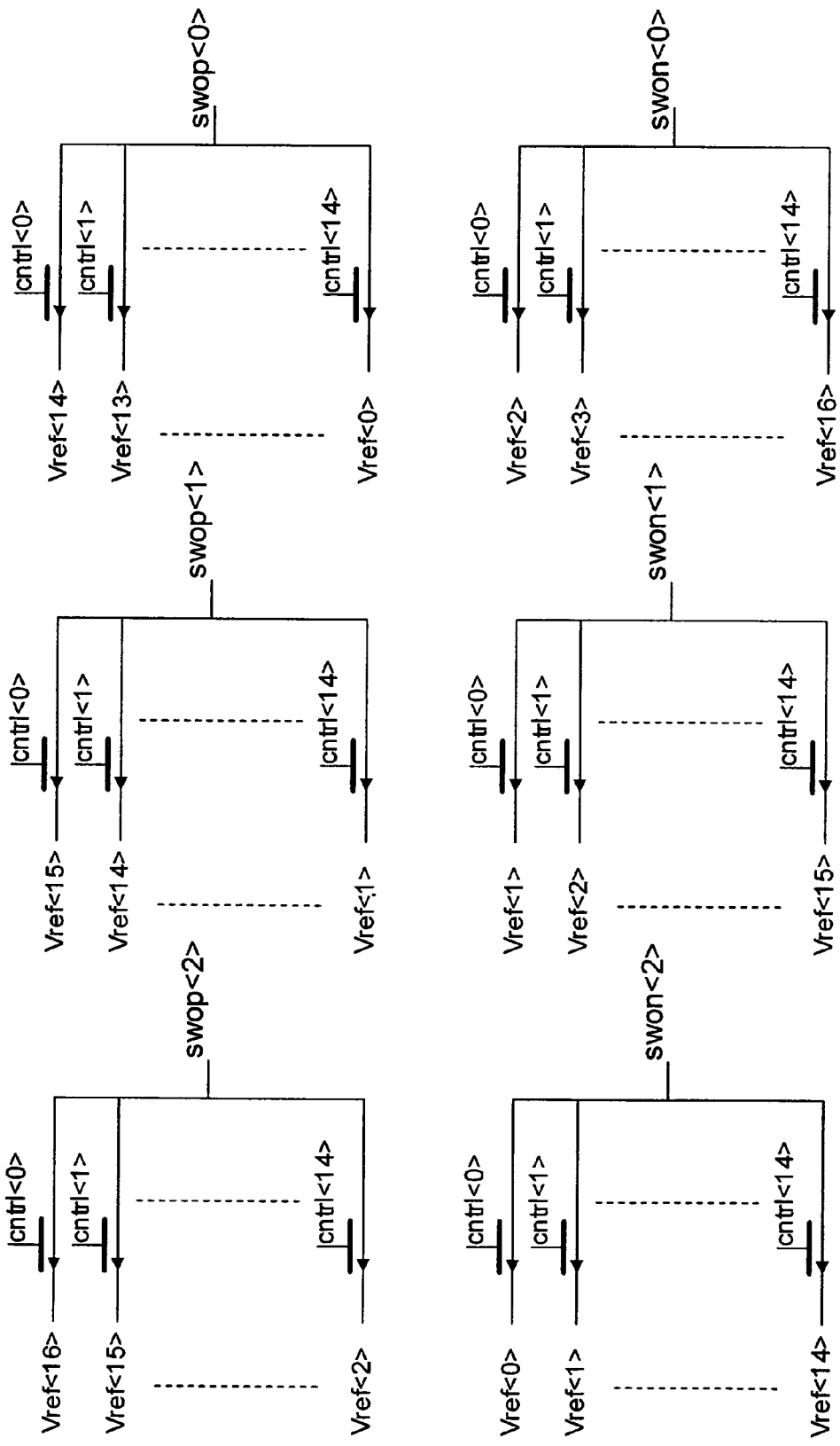

For example, the 8 bit subranging ADC has 15 cntrl signals, which means that a total of 90 switches are required in the switch matrix 103. The description of the switch matrix 103 is shown in the box in FIG. 12, and is further illustrated in FIG. 13. Note that the switches for 'swop' and 'swon' are controlled by the same control signals.

Figure 14:
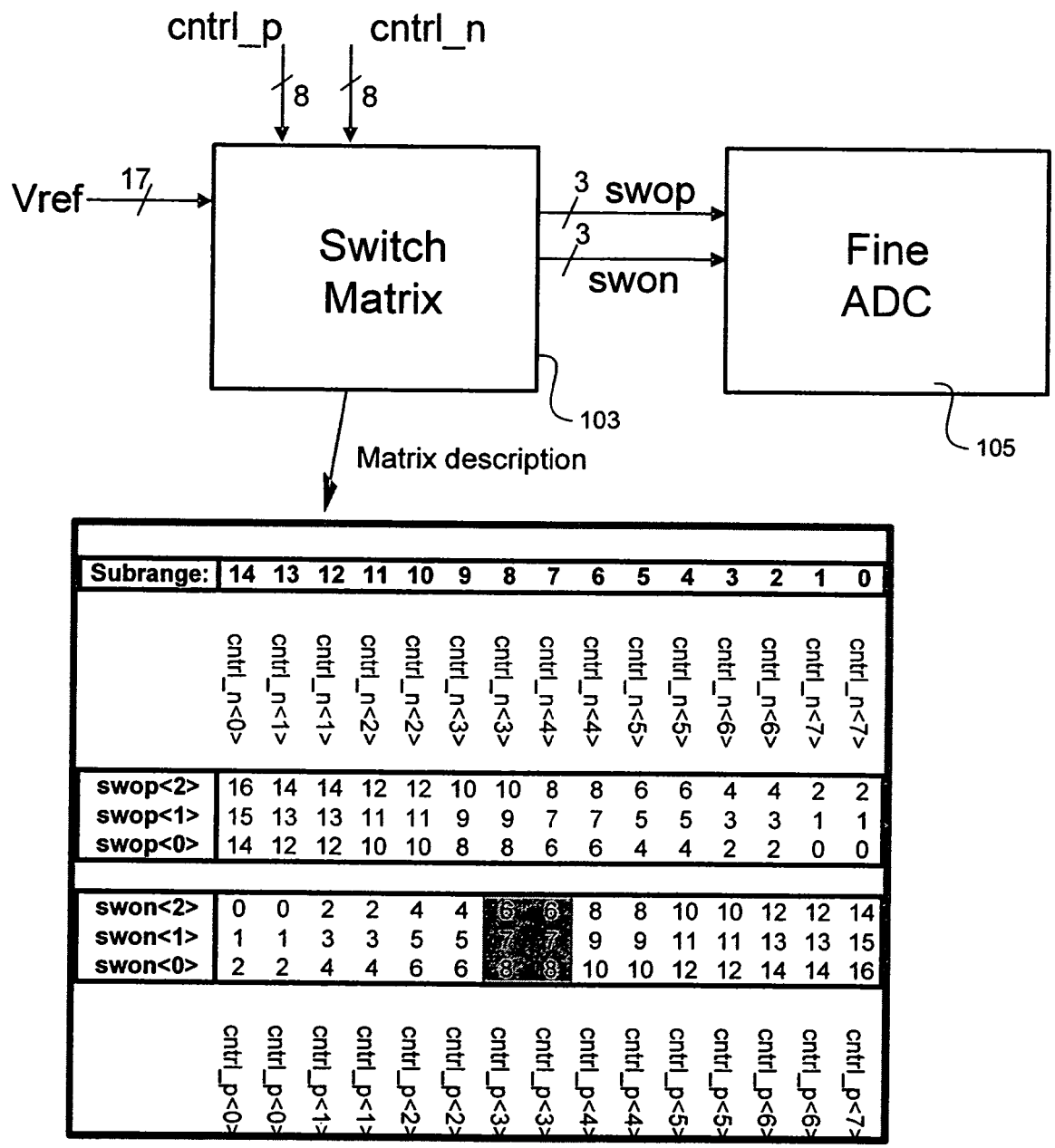
FIGS. 14-15 illustrate a switch matrix of the present invention used in a subranging ADC.

A method and circuit is proposed to reduce the number of switches used in the switch matrix 103. FIG. 14 illustrates a switch matrix 103 of the present invention used in the subranging ADC. This approach has advantages of using 2×fewer switches inside the switch matrix 103, and 2×smaller drivers for the 'cntrl' signals.

Figure 15:
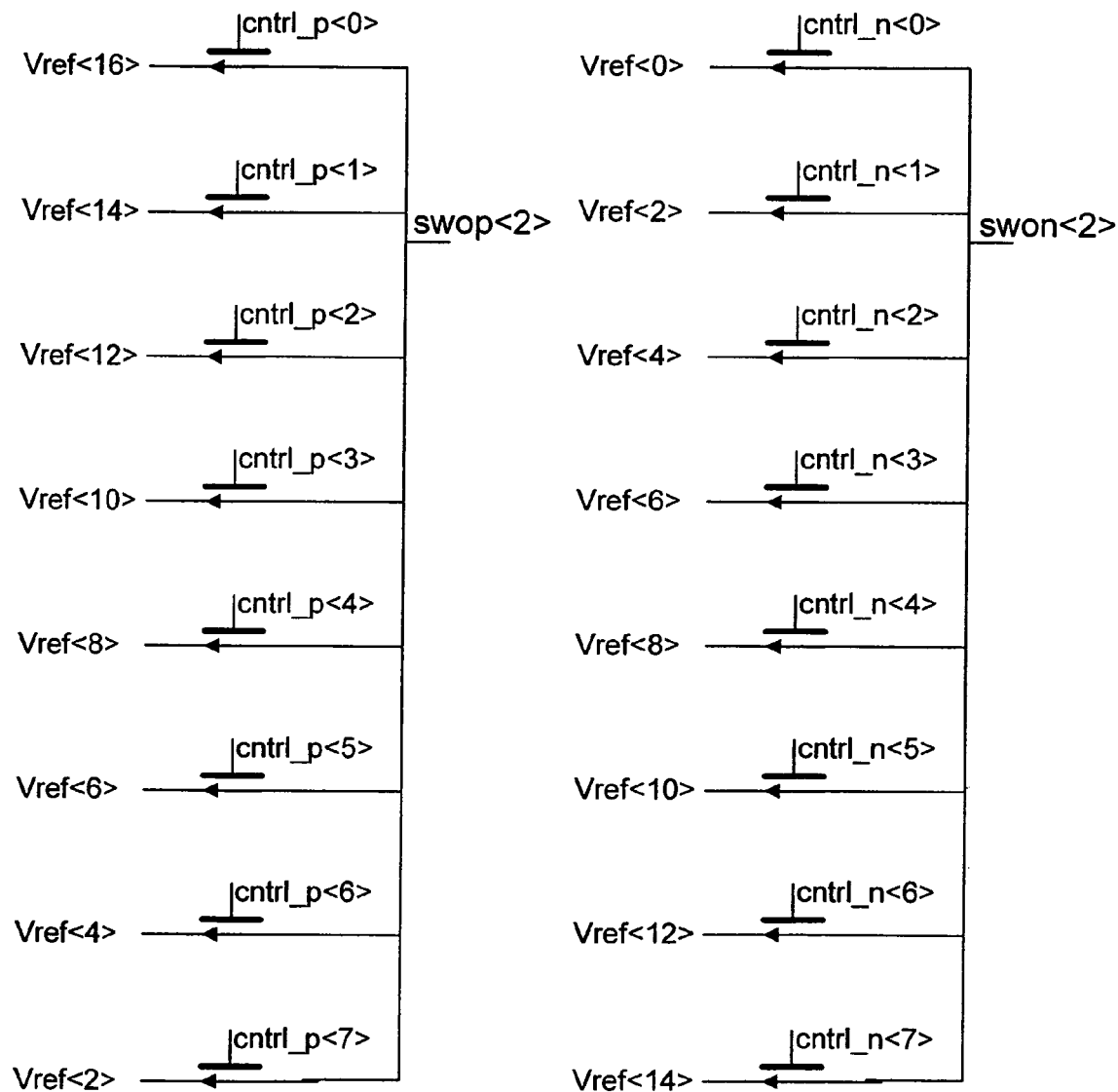

The proposed switch matrix 103, for the 8b ADC, is shown in FIG. 14. In the proposed switch matrix 103, the 'swop' and 'swon' signals are controlled by separate control signals ('cntrl$_{13}$ p' and 'cntrl$_{13}$ n'), as further illustrated in FIG. 15. (Note that swop<1>, swop<0>, swon<1>, swon<0> are not shown in this figure.)

During the clock phase when the fine ADC 105 connects to the resistor ladder, only one cntrl_p and one cntrl_n signal is high. Each cntrl_p/cntrl_n signal is high for two consecutive subranges. Therefore, one set of reference voltages (in this case, three references voltages), and therefore also set of switches (in this case, three switches), is used in two consecutive subranges (as illustrated by the grey color in FIG. 14). Phrased another way, the switch matrix 103 inputs control signals for selecting at least two voltage subranges at substantially the same time. Hence, since all switches can be used twice, the total number of switches is halved (to 48 switches, vs. 90 in FIG. 13), resulting in using less area. It also results in lower parasitics, which in turn means higher bandwidth for the overall ADC.

Note that the use of the proposed method and circuit can result in a small difference in common-mode voltages between two consecutive subranges. The difference equals $$\Delta Vcm = \frac{V_{ref,max}}{2^{M+1}},$$

where M is the number of bits in the coarse ADC, and $V_{ref,max}$ is the maximum ADC input voltage. For instance, for a 5 bit coarse ADC and $V_{ref,max}$=1.4V, $\Delta Vcm$=22 mV. This value is sufficiently small to be handled by the fine ADC 105 amplifiers.

Note also that the switch matrix as described herein is applicable not just to subranging ADCs, but also to PGAs and DACs.

CONCLUSION

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An autozero amplifier comprising:
    a positive input terminal;
    a negative input terminal;
    a first capacitor connected to said positive input terminal;
    a second capacitor connected to said negative input terminal;
    a first pair of transistors with their corresponding drains connected to the first capacitor at a common node
    wherein the source of a first transistor of said first pair of transistors is connected to a positive threshold voltage,
    the source of a second of said first pair of transistors is connected to a positive voltage terminal of a resistor ladder,
    and
    the gates said first pair of transistors are connected to a non-overlapping two-phase clock;
    and
    a second pair of transistors with their drains connected to the second capacitor at a common node
    wherein the source of a first of said second pair of transistors is connected to a negative threshold voltage,
    the source of a second of said second pair of transistors is connected to a negative voltage terminal of said resistor ladder,
    and
    the gates said second pair of transistors are connected to said non-overlapping two-phase clock.

2. The autozero amplifier of claim 1, wherein said autozero amplifier is used in a programmable gain amplifier.

3. The autozero amplifier of claim 1, wherein said autozero amplifier is used in a digital to analog converter (DAC).

4. The autozero amplifier of claim 1 wherein said amplifier is used in a coarse analog to digital converter.

5. The autozero amplifier of claim 1, wherein said autozero amplifier is part of an array of autozero amplifiers.

* * * * *